United States Patent
Soraghan et al.

(10) Patent No.: US 6,385,561 B1
(45) Date of Patent: May 7, 2002

(54) AUTOMATIC FAULT LOCATION IN CABLING SYSTEMS

(75) Inventors: John James Soraghan; Wah Hoon Siew, both of Glasgow (GB)

(73) Assignee: University of Strathclyde, Glasgow (GB)

(*) Notice: Subject to any disclaimer, the term of this patent is extended or adjusted under 35 U.S.C. 154(b) by 0 days.

(21) Appl. No.: 09/269,392
(22) PCT Filed: Sep. 26, 1997
(86) PCT No.: PCT/GB97/02632
  § 371 Date: May 13, 1999
  § 102(e) Date: May 13, 1999
(87) PCT Pub. No.: WO98/13700
  PCT Pub. Date: Apr. 2, 1998

(30) Foreign Application Priority Data
Sep. 28, 1996 (GB) ............................................. 9620288

(51) Int. Cl.$^7$ ................................................. G06F 11/30
(52) U.S. Cl. ................. 702/185; 324/456; 324/532; 324/534; 324/535; 324/536; 324/539; 324/540; 702/58; 702/59
(58) Field of Search ....................... 702/185, 58, 59; 324/456, 532, 534, 535, 536, 539, 540

(56) References Cited
U.S. PATENT DOCUMENTS

| | | | |
|---|---|---|---|
| 4,291,204 A | * 9/1981 | Crick | ............................ 324/456 |
| 5,321,365 A | 6/1994 | Diamond et al. | ............ 324/603 |
| 5,369,366 A | 11/1994 | Piesinger | ................... 324/533 |
| 5,534,783 A | * 7/1996 | Meyer | ......................... 324/533 |
| 5,650,728 A | * 7/1997 | Rhein et al. | ................. 324/543 |

FOREIGN PATENT DOCUMENTS

| | | |
|---|---|---|
| DE | 30 16 223 | 11/1980 |
| EP | 0 313 020 | 4/1989 |

OTHER PUBLICATIONS

Koga, Et Al., "Study of Fault–Location Expert Systems for Paired Cables", *Electronics and Communications in Japan, Part I: Communcations*, vol. 74, Oct. 1991, No. 10, New York, pp. 58–66.

G. Shorrock, "Line Fault Prediction and Location in Echo Cancelling Data Transmission Systems", *Eletronics Letters*, Jan. 1984, vol. 20, No. 1, pp. 24–25.

* cited by examiner

Primary Examiner—Arthur T. Grimley
Assistant Examiner—John Le
(74) Attorney, Agent, or Firm—Alston & Bird LLP

(57) ABSTRACT

A method and apparatus (12–20, 32) for automatically locating faults in a network of signal carriers (cables) utilises an interrogation waveform which is pulse-like in form and receives composite reflected signals from the carriers which are a time distributed collection of individual reflections. These are sampled and compared using the function of an adaptive filter (52) to minimise the difference signal. The difference signals are analysed to determine significant points of departure which identify the fault location which is then represented as a distance value.

8 Claims, 5 Drawing Sheets

AUTOMATIC FAULT LOCATION IN CABLING SYSTEMS

FIELD OF THE INVENTION

The present invention relates to a method and apparatus for locating faults in a network of signal carriers such as electrical or optical cabling systems. In particular, it relates to networks which contain multiple joints, such as low voltage electrical signal or power distributions systems.

BACKGROUND OF THE INVENTION

Locating faults in underground cabling systems is currently achieved using a pulse echo technique. In the pulse echo technique, an interrogation pulse is transmitted along the system from a test site, this pulse is reflected by any fault in the cable system, and the elapsed time between the initial pulse and the reflected pulse being received at the test site is used to calculate the distance of the fault from the test site.

This technique works well in systems which do not have nodes (such as joints) which generate reflections of the pulse even though they are not faulty. However, when this technique is used in systems with multiple joints (such as low voltage electrical distribution systems or telecommunications systems) then each joint may introduce a reflection of the pulse in addition to the reflection generated by the fault or disruption.

Thus, data produced by the pulse echo technique performed on a system with multiple joints is difficult to interpret. Skilled interpretation of this data is required to distinguish between reflections from joints and reflections from faults.

Even with skilled interpretation of the data from a multijoined system where there may be more than one possible location of the fault, it is difficult to locate the fault to an accuracy of less than several meters for each of these possible locations.

Using standard echo pulse techniques for tracing faults in multijoined systems (particularly where the cable is buried underground or is otherwise inaccessible) is very expensive because of the uncertainty in distinguishing between reflections due to joints and reflections due to faults, and because of the inaccuracy in determining the precise location of the faults.

SUMMARY OF THE INVENTION

It is an object of the present invention to improve fault-finding in cabling systems. It is another object to distinguish between faultless nodes (which produce reflections) and faults. It is a further object to reduce the amount of skill needed to interpret the results of fault location apparatus. It is a further object to automate the fault locating process.

The general solution to the above problem is to compare pairs of signals from different signal carriers of the network under test and adaptively process the signals to determine any key deviations. These deviations may indicate the locations of the faults.

According to a first aspect of the present invention there is provided a method for locating faults in a network of signal carriers comprising establishing a test site where signal carriers of the network can be accessed: delivering an interrogation pulse-like waveform along a first set of signal carriers; receiving a first composite reflected signal from the first set of signal carriers and which is a time-distributed collection of individual reflections; sampling the first composite reflected signal at time intervals and storing the samples; delivering the same interrogation pulse-like waveform along a second set of signal carriers; receiving a second composite reflected signal from the second set of signal carriers and which is a time-distributed collection of individual reflections; sampling the second composite reflected signal at time intervals and storing the samples; consecutively comparing in pairs, samples of the first composite reflected signal with those of the second composite reflected signal using the function of an adaptive filter and comparator arranged consecutively to adapt the samples of the first composite reflected signal to minimise the different signal, between the output of the adaptive filter and the second composite reflected signal, at the output of the comparator; identifying the time interval at which the difference signal exceeds a threshold value; and scaling the time domain position of the identified time interval to represent the distance to a fault in the signal carriers from the test site.

According to a second aspect of the present invention there is provided a fault locator for carrying out the method of the first aspect comprising an adaptive filter and a comparator.

By virtue of the present invention the location of the fault position is automatically obtained from the filtered error signal due to the adaptive processing effectively learning about the similarities between cable characteristics for all locations prior to the fault and utilising this knowledge to determine where significant departure from the norm exists.

It will be understood that the pulse-like waveform is a finite-duration waveform and for example may be a simple pulse of square, rectangular or triangular shape or it may be of damped sinusoid form for example having only two sinusoidal periods of which the amplitude of the second is less than that of the first.

The method and apparatus may be operated and controlled remotely from the test site and may be operated in a trigger mode where the trigger signal is provided automatically resulting from an event of interest such as a voltage or current surge.

Furthermore the network of signal carriers may be arranged to carry electrical signals and/or power in which case the interrogation waveform is itself an electrical signal or the network may be arranged to carry optical signals in which case the interrogation waveform is itself an optical signal for example a transformed electrical signal, and of course the composite reflected signals are transformed to electrical signals for processing.

The network may have any number of signal carriers per cable, for example, ten or more as is conventionally used in telecommunications, or it may have only three carriers per cable as is conventionally used in electrical power distribution networks.

BRIEF DESCRIPTION OF THE DRAWINGS

For a better understanding of the present invention and to show how the same may be carried into effect, reference will be made to the accompanying diagrams, in which.

DETAILED DESCRIPTION

Figure 1:
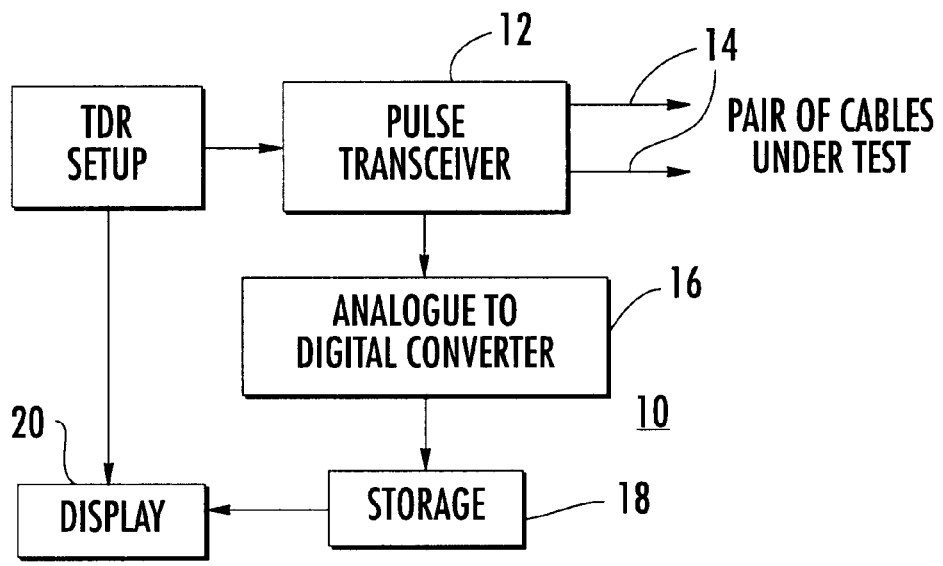
FIG. 1 is a block diagram of a known print-cut TDR (Time Domain Reflectometer)

FIG. 1 shows a conventional TDR 10 for connection to a pair of signal carriers or cables to be tested. A typical network containing a fault has many cables, therefore, pairs of cables are usually tested in sequence until all of the cables have been tested. A pulse transceiver 12 is used to interrogate (by launching an electrical pulse at an established test site where the signal carrier or cables of the network can be accessed) all possible pairs of cables (one pair at a time) via test leads 14. The resulting composite reflected analogue signals are converted by an A/D converter 16 and stored in the TDR storage area 18. The stored data is displayed on the TDR display 20 as pairs of signals.

Conventional TDRs are used in the well-established compare and contrast scheme of fault finding. In the compare and contrast scheme the signals from pairs of phases of a 3-phase electrical distribution network are combined (added or subtracted) to form composite signals which are compared to each other by a skilled person. The skilled person endeavours to isolate any key deviations (deviation points) between the two composite signals which may indicate the fault location. The skilled person locates the deviation points manually using a cursor control provided by the TDR. Once the deviation points have been located manually, the actual distances to the faults are displayed by the TDR using a standard formula.

Figure 2A:
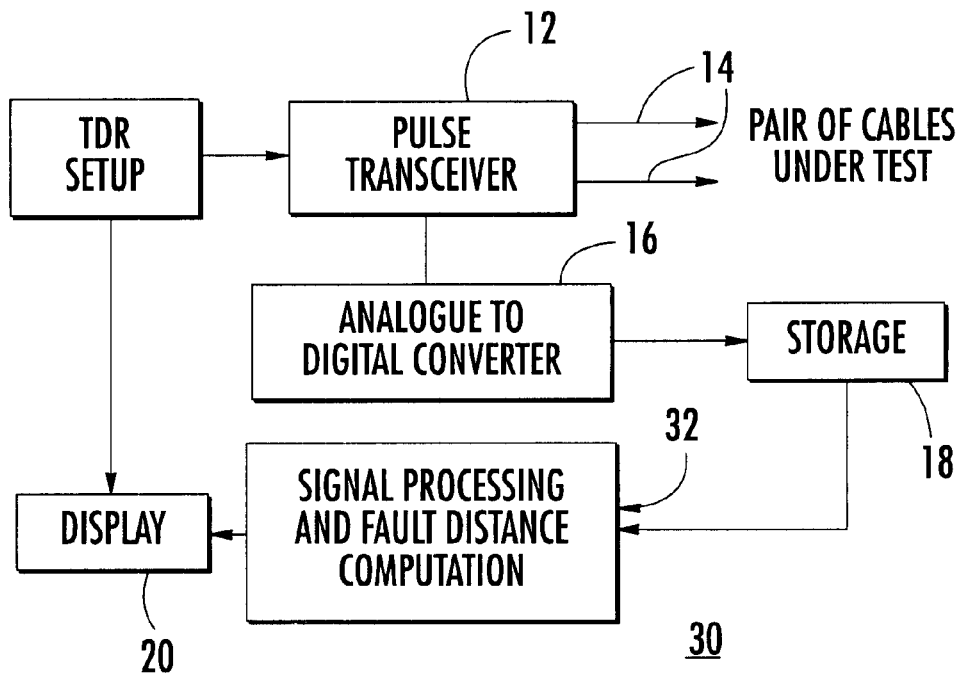
FIG. 2a is a block diagram of a TDR according to the present invention.

A TDR 30 in accordance with the present invention, shown in FIG. 2a is used to automate and improve the existing compare and contrast method. FIG. 2a shows the modified TDR 30 which is similar to the standard TDR 10 having components 12, 14, 16, 18 and 20 but with an additional component 32 for signal processing and automatic fault distance computation and which operates by processing individual stored samples held in the storage area 18 before issuing the result to display 20.

Figure 2B:
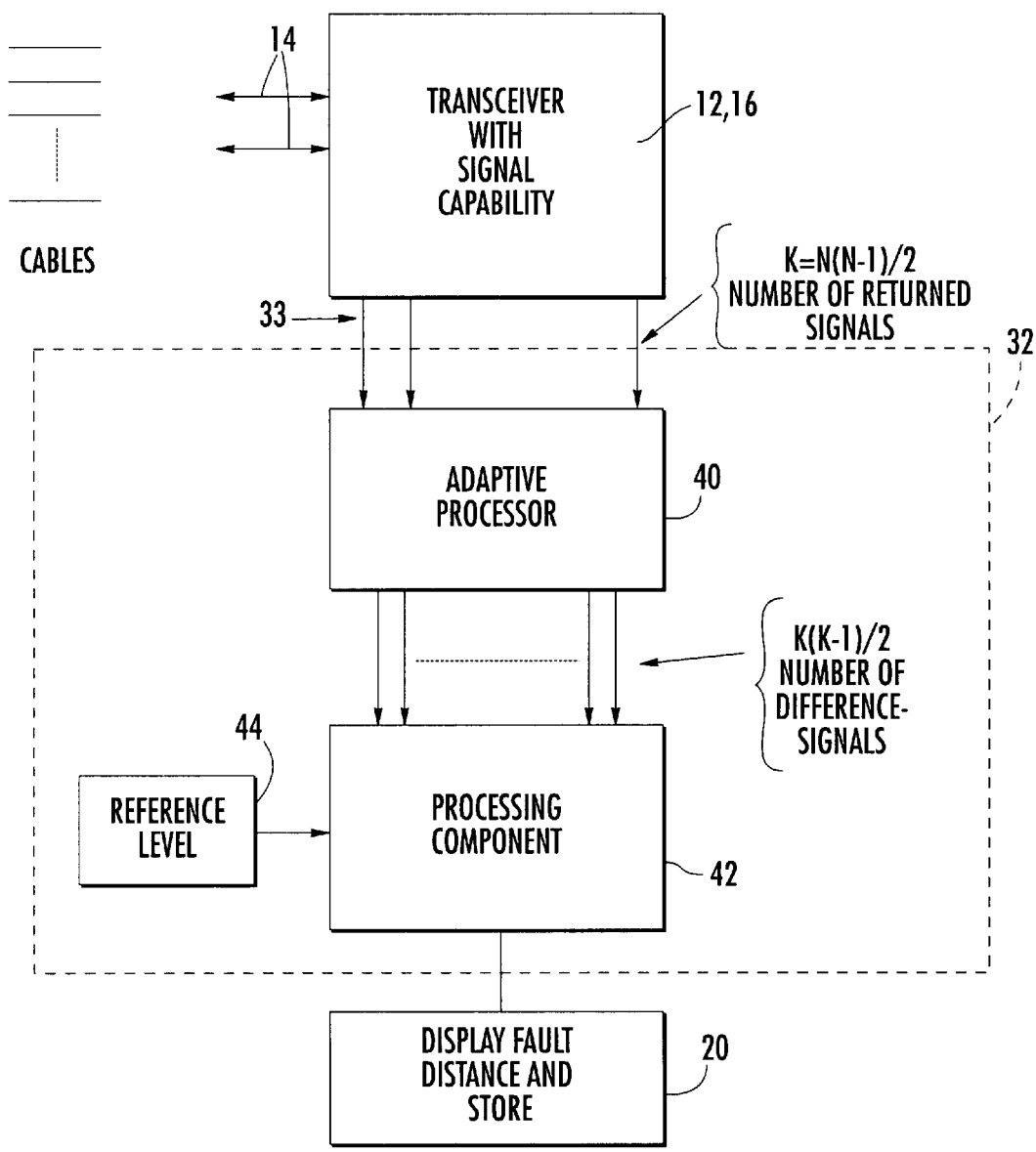
FIG. 2b illustrates part of FIG. 2a in greater detail.

The additional component for signal processing, smoothing and fault distance computation (the processing component 32) is shown in more detail in FIG. 2b and comprises an adaptive processor 40 receiving signals of leads 33 from the transceiver and A/D convertor 12, 16. The processor 40 generates difference signals which are delivered to a store/comparator and distance computation unit 42 which is provided with a reference input 44. The output from unit 42 is delivered to the display 20.

The reference input 44 represents a threshold level and a velocity factor and can be altered, although it is envisaged that most users will not need to alter at least the threshold level, therefore in some embodiments of the present invention the means to alter the threshold may not be apparent to the user. The threshold level may need to be altered to optimise performance as will be explained. For example, if use of the TDR is being transferred from one cable type to another or from one geographical location to another. Altering the threshold level may offset changes introduced by various factors, including use in a different environment, differing cable characteristics, differing numbers of nodes in each cable system, and differing numbers of users of each node. The velocity factor which forms part of the reference input 44 is determined by cable type and is a measure of how fast the pulse travels along the cable.

Figure 3A:
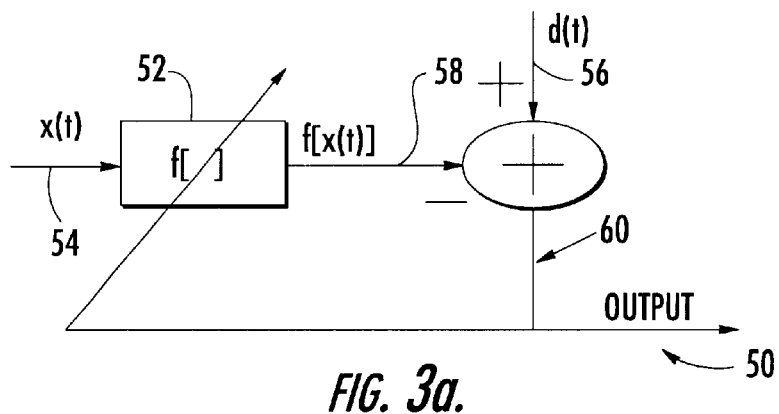
FIG. 3a illustrates a basic adaptive processing element used in FIG. 2b.

The adaptive processor 40 is composed of a sequence of individual adaptive processing elements 50 one of which is shown in FIG. 3a. Adaptive processing is a known technique which used a conventional filter 52 whose characteristics can be altered adaptively. That is, there is a mechanism which enables the filter to be adapted in use. A first signal 54 is input to the adaptive filter 52, a second signal 56 is used as a reference signal. The adaptive filter output 58 is compared with the reference signal 56 to produce a difference signal 60 which is used to alter the characteristics of the adaptive filter 52 in such a way as to minimise the difference signal 60. The adaptive processing elements 50 may be linear or non-linear. The inputs to the adaptive filter 52 are both sampled versions of the signals received from the pairs of cables under test.

Figure 3B:
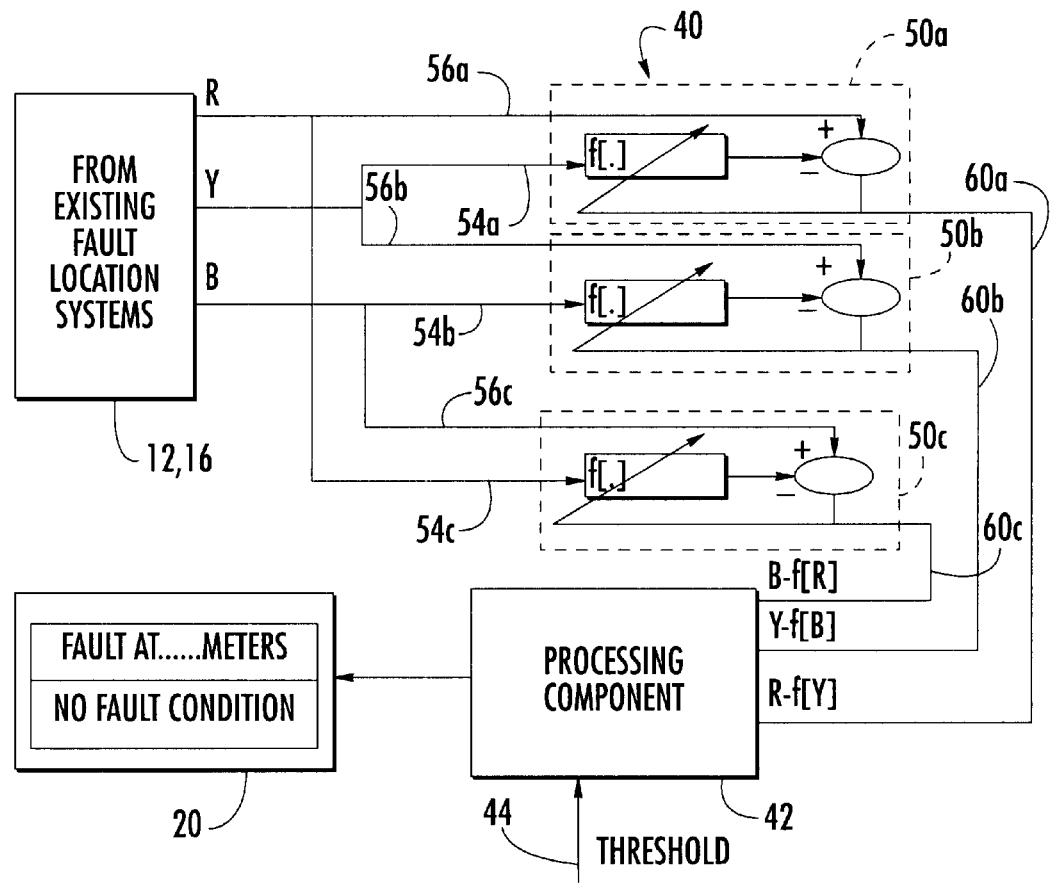
FIG. 3b illustrates part of FIG. 2b in greater detail and utilising the elements of FIG. 3a for a 3 cable system.

FIG. 3b shows the structure of an adaptive processor 40 for testing a three cable system, the individual phases of which are denoted R, Y, and B. The processor 40 has three adaptive processing elements 50a, 50b, 50c, one for each combination of pairs of the three cables. The difference signals 60a, 60b, 60c from each adaptive processing element is input to the processing component 42 which stores, compares, and smoothes the difference signals 60a, 60b, 60c and then calculates the distance to the fault or faults automatically.

Figure 4:
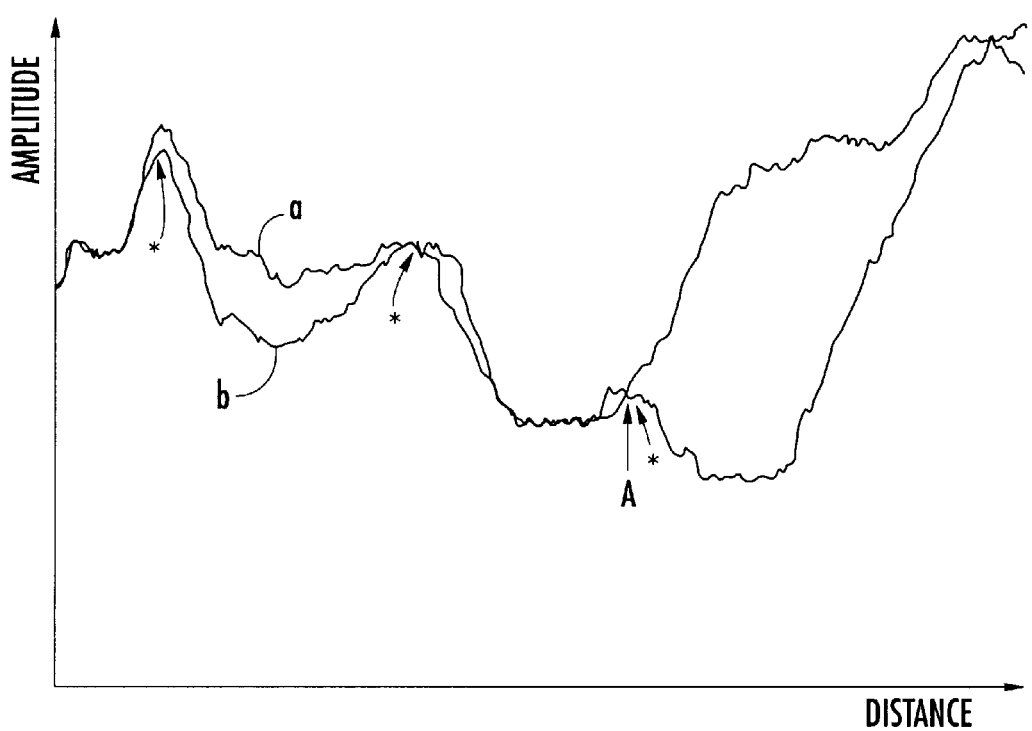
FIG. 4 shows two composite reflected signals from a cable system with multiple joints.

FIG. 4 shows an example of the signals received from two phases under test. The x axis of FIG. 4 represents distance, the y axis represents the amplitude of the signal. One of the signals (labelled a) is used as a reference signal 56 for the adaptive filter 52, the other signal (labelled b) is the input 54 to the adaptive filter.

A each adaptive processing element 50 receives sampled input signals it operates on corresponding pairs of sampled data. That is, the adaptive processing element 50 receives a sampled data point from each of the two sampled input signals; it consecutively operates on pairs of sampled data points; it automatically filters one sampled signal (signal b) on an individual sample basis, and compares each filtered sample point with the corresponding sample point from the second (reference) sampled signal (signal a); and it automatically alters the characteristics of the adaptive filter 52 to minimise the difference between the inputs. Standard techniques exist for performing this function. The result of minimising the difference signal 60 using adaptive filtering is to provide a more accurate difference signal 60 which is a clean measure of the key differences between the two signals a and b, for example, as shown in FIG. 5a.

Figure 5A:
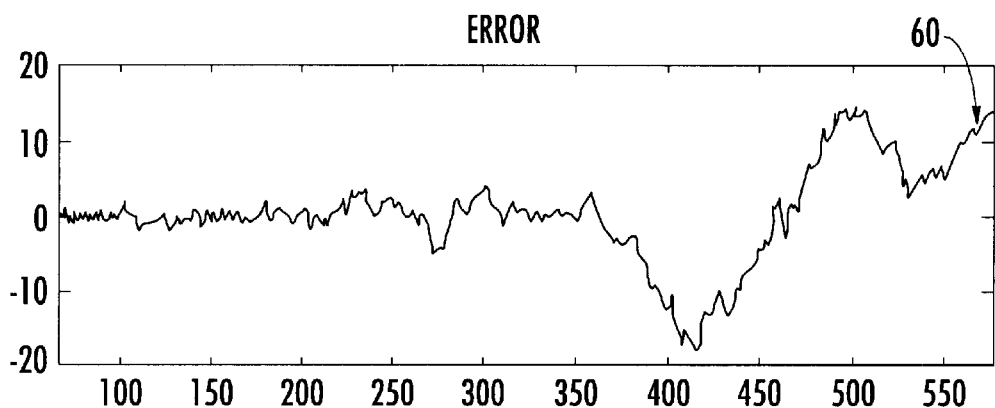
FIG. 5a shows the unsmoothed signal resulting from an adaptive processed comparison of the FIG. 4 signals.
Figure 5B:
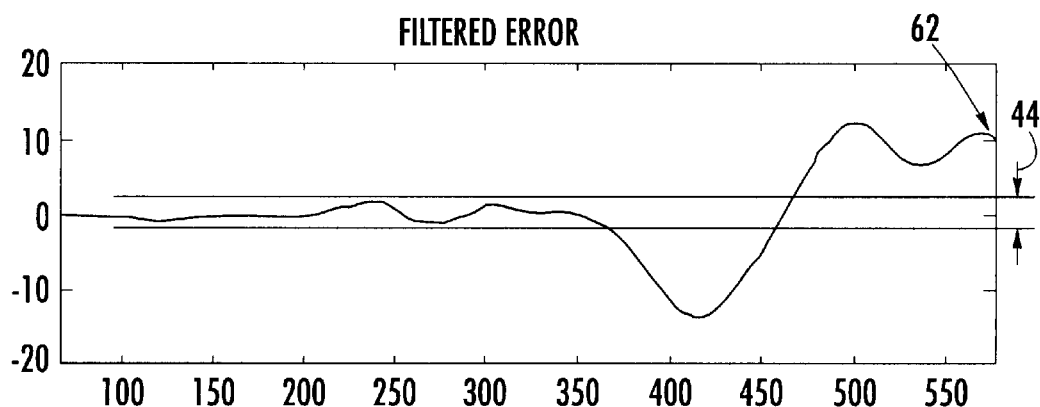
FIG. 5b shows the method signal resulting from an adaptive processed comparison of the FIG. 4 signals.

The difference signals 60 (for the three cable system) input to the processing component 42 are smoothed by the processing component 42 to produce smoothed difference signals 62, for example, as shown in FIG. 5b. Three smoothed difference signals result from the difference signals 60a, 60b, and 60c of FIG. 3b. The predetermined threshold level from the reference input 44 is then applied to the smoothed difference signals 62, as indicated in FIG. 5b. In FIG. 5b the predetermined threshold is shown by y axis lines at plus and minus two units.

In FIGS. 5a and 5b the x axis represents distance and the y axis represents amplitude.

The processing component 42 compares the smoothed difference signals 62a, 62b, 62c from each adaptive processing element 50a, 50b, 50c with the threshold or reference level input 44, and determines whether the particular smoothed difference signal 62a, 62b, 62c is outside, i.e., above the predetermined threshold or not.

If the particular smoothed difference signal 62 is outside the predetermined threshold (plus and minus 2 units in this case), then there are no faults in the cables being tested by the corresponding adaptive processing element 50.

If a particular smoothed difference output 62 is outside the predetermined threshold then the processing component 42 identifies the point in which the smoothed difference output 62 exceeds the threshold as a possible fault location. The component 42 then calculates the distance to the possible fault location from the test site and displays the result in the display 20. The calculation of the distance to the possible fault location is performed using standard techniques including use of a velocity factor as previously described. By comparing the possible fault location results of the various smoothed difference signals 62, the processing component 42 determines the most probable fault location in the cable.

By way of illustration and referring to FIG. 4, the TDR of FIG. 2a identifies the most probable fault location as that denoted 'A' whereas there are actually three possible fault locations each marked with an asterisk which would be considered by the human observer using the prior art TDR of FIG. 7. However, due to the use of the adaptive filtering mechanism in the TDR of FIG. 2a, the system learns the similarities in the cable characteristics and identifies that the departure at A is the only significant departure between the waveforms a and b and, therefore, identifies A as the fault location.

Due to the fact that multiple joints exist there will inevitably be the existence of ambiguity of the fault location as determined by the processing component 42. This ambiguity is addressed by considering the secondary or higher order reflected signal components of the composite reflected signals in relation to the result from the primary composite reflected signals. For example, consider a cable section comprising a single 10 meters branch at 12 meters along the 30 meter length. Assuming that a fault occurs at the branch end, then analysing the composite reflected signals will detect a fault at 22 meters. This is the primary difference signal. The ambiguity to be resolved is whether this fault occurs at 22 meters on the main cable or at the branch end. This is achieved by analysing the secondary or higher order difference signals. If we determine through the instrument that there exists a significant difference signal at 30 meters then this will have resulted from a reflection at the end of the main cable and thus the fault is along the main cable at 22 meters. If we determine through the instrument that there exists a significant difference signal at 32 meters then this will have resulted from a reflection at the end of the branch cable and thus the fault is at the end of the branch cable.

There is a certain learning period associated with the adaptive processing element. During the learning period no faults will be detected. The effect of this is that there is a certain distance from the test site (the location at which the cables are pulsed) along the cables under test over which faults cannot be located.

There is a trade-off in determining the learning period. The shorter the learning period the greater the variations in the difference signal 60 before the adaptive filter 52 has optimised the matching process (minimised the difference signal 60), but the shorter the learning distance. The learning distance is the distance from the test site over which faults cannot be detected. Use of a slower learning period produces smaller variations in the difference signal 60, but increases the learning distance.

If no fault is detected in a known faulty line then the fault may have occurred in the learning distance. To determine if the fault did occur in the learning distance the test site is moved to another position, for example at the other end of the cables. The location of the fault should then be identified using the procedure described above.

The present invention may also be incorporated into existing equipment, for example the transceiver function may be performed by a conventional time domain reflectometer.

It will be appreciated that the adaptive filters 52 could be fixed after a certain period of time, and pulse compression may be used to facilitate long range, high resolution detection of faults.

What is claimed is:

1. A method for locating faults in a cable network of multi-conductor electrical cables comprises:

establishing a test site where the multiple conductors of a cable in the network can be accessed;

delivering an interrogation waveform along a first conductor pair of the cable; said interrogation waveform being of finite duration and pulse-like in form; receiving from the first conductor pair a first composite reflected signal which is a time-distributed collection of individual reflections;

sampling the first composite reflected signal at time intervals and storing the samples;

delivering the same interrogation waveform along a second conductor pair of the cable; receiving from the second conductor pair a second composite reflected signal which is a time-distributed collection of individual reflections; sampling the second composite reflected signal at time intervals and storing the samples;

comparing the first and second composite reflected signals to identify deviations there-between by consecutively comparing amplitudes of sample pairs from the first and second composite reflected signals using a function of an adaptive filter and a comparator, the adaptive filter and comparator being arranged consecutively to adapt the samples of the first composite reflected signal to minimise at the output of the comparator the difference signal between the output of the adaptive filter and the second composite reflected signal;

identifying a time interval at which the difference signal exceeds a threshold value; and scaling a time domain position of the identified time interval to represent the distance from the test site to a fault in the conductors.

2. A method of locating faults according to claim 1, wherein comparison is made between the samples from the composite reflected signals of substantially all possible pairs of conductors in the multi-conductor electrical cable to provide a plurality of possible fault locations and subsequently comparing the possible fault locations to determine the most probable fault location.

3. A method according to claim 1 or claim 2, wherein the interrogation waveform is a compressed pulse to increase range and enhance the resolution of the method.

4. A method for locating faults in a cable network of multi-fibre optical cables comprises:

establishing a test site where the multiple fibres of a cable in the network can be accessed;

delivering an interrogation waveform along a first set of fibres of the cable; said interrogation waveform being of finite duration and pulse-like in form; receiving from the first set of fibres a first composite reflected signal which is a time-distributed collection of individual reflections;

sampling the first composite reflected signal at time intervals and storing the samples;

delivering the same interrogation waveform along a second set of fibres of the cable; receiving from the second set of fibres a second composite reflected signal which is a time-distributed collection of individual reflections; sampling the second composite reflected signal at time intervals and storing the samples;

comparing the first and second composite reflected signals to identify deviations there-between by consecutively comparing amplitudes of sample pairs from the first and second composite reflected signals using a function of an adaptive filter and a comparator, the adaptive filter and comparator being arranged consecutively to adapt the samples of the first composite reflected signal to minimise at the output of the comparator the difference signal between the output of the adaptive filter and the second composite reflected signal;

identifying a time interval at which the difference signal exceeds a threshold value; and scaling a time domain position of the identified time interval to represent the distance from the test site to a fault in the fibres.

5. A method of locating faults according to claim 4, wherein comparison is made between the samples from the composite reflected signals of substantially all possible sets of fibres in the optical cable to provide a plurality of possible fault locations, and subsequently comparing the possible fault locations to determine the most probable fault location.

6. A method according to claim 4 or claim 5, wherein the interrogation waveform is a compressed pulse to increase range and enhance the resolution of the method.

7. A fault locating apparatus for locating faults in the cable network of multi-conductor electrical cables or multi-fibre optical cables, said apparatus comprising input/output leads, a transceiver for delivering interrogation waveforms to the network via the input/output leads, storage means for receiving, sampling and storing samples of at least one pair of composite reflected signals, adaptive filter and comparator means for receiving sample pairs from the second composite reflected signals, consecutively comparing amplitudes of said sample pairs, and adapting the samples of one composite signal to minimise the difference between the compared amplitudes, and processing means to determine a time interval when the difference exceeds a predetermined threshold, and scaling a time domain position of the identified time interval to represent the distance from the test site to a fault in the network.

8. A fault locating apparatus according to claim 7, including means for deciding which branch of a multi-branched network contains the fault.

* * * * *